United States Patent
Quan et al.

(10) Patent No.: US 8,390,355 B2
(45) Date of Patent: Mar. 5, 2013

(54) DELAY CELL FOR CLOCK SIGNALS

(75) Inventors: Xiaohong Quan, San Diego, CA (US); Ankit Srivastava, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 95 days.

(21) Appl. No.: 13/032,326

(22) Filed: Feb. 22, 2011

(65) Prior Publication Data

US 2012/0212265 A1    Aug. 23, 2012

(51) Int. Cl.
*H03H 11/26* (2006.01)

(52) U.S. Cl. ........................................ 327/261; 327/262

(58) Field of Classification Search .......... 327/261–262, 327/512–513
See application file for complete search history.

(56) References Cited

U.S. PATENT DOCUMENTS

| | | | | |
|---|---|---|---|---|
| 5,081,380 | A * | 1/1992 | Chen | 327/262 |
| 6,509,774 | B2 * | 1/2003 | Park et al. | 327/262 |
| 7,019,576 | B1 * | 3/2006 | Sancheti et al. | 327/261 |
| 7,619,457 | B1 * | 11/2009 | Mai | 327/276 |
| 7,750,837 | B2 | 7/2010 | Wang et al. | |
| 7,969,219 | B2 * | 6/2011 | Venkataraman et al. | 327/237 |
| 2004/0041604 | A1 | 3/2004 | Kizer et al. | |
| 2008/0157824 | A1 | 7/2008 | Pan | |
| 2009/0160535 | A1 | 6/2009 | Rengachari et al. | |

OTHER PUBLICATIONS

International Search Report and Written Opinion—PCT/US2012/025695—ISA/EPO—May 18, 2012.

* cited by examiner

*Primary Examiner* — An Luu
(74) *Attorney, Agent, or Firm* — Kevin T. Cheatham

(57) ABSTRACT

An integrated circuit for delaying a clock signal using a delay cell is described. The integrated circuit includes a current starved inverter. The current starved inverter includes a switched capacitor current source with a first dummy inverter, a first amplifier coupled to the first dummy inverter and a first capacitor coupled to the first amplifier via a first switch. The current starved inverter also includes a first transistor coupled to the current source. The integrated circuit also includes a second capacitor. A delay applied to the clock signal is dependent on a ratio between the first capacitor and the second capacitor. The first capacitor and the second capacitor may be located in proximity such that process, voltage and temperature variations affect the first capacitor and the second capacitor similarly and the delay applied to the clock signal is independent of process, voltage and temperature variations.

45 Claims, 12 Drawing Sheets

DELAY CELL FOR CLOCK SIGNALS

TECHNICAL FIELD

The present disclosure relates generally to wireless communication systems. More specifically, the present disclosure relates to systems and methods for a delay cell for clock signals.

BACKGROUND

Electronic devices have become smaller and more powerful in order to meet consumer needs and to improve portability and convenience. Consumers have become dependent upon wireless communication devices such as cellular telephones, personal digital assistants (PDAs), laptop computers and the like. Consumers have come to expect reliable service, expanded areas of coverage and increased functionality.

Wireless communication systems are widely deployed to provide various types of communication content such as voice, video, data and so on. These systems may be multiple-access systems capable of supporting simultaneous communication of multiple terminals with one or more base stations.

An electronic device may include one or more integrated circuits. These integrated circuits may include analog and digital circuitry. Such circuitry may include inductors, transistors and capacitors. The parameters of integrated circuit components may vary based on process, voltage and temperature (PVT) variations. Such variations may cause the operation of circuits to vary considerably. Benefits may be realized by improved electronic devices that are less dependent on PVT variations.

SUMMARY

An integrated circuit for delaying a clock signal using a delay cell is described. The integrated circuit includes a current starved inverter. The current starved inverter includes a switched capacitor current source. The switched capacitor current source includes a first dummy inverter, a first amplifier coupled to the first dummy inverter and a first capacitor coupled the first amplifier via a first switch. The current starved inverter also includes a first transistor coupled to the switched capacitor current source. The current starved inverter further includes a switched capacitor current sink. The switched capacitor current sink includes a second dummy inverter having a configuration similar to the first dummy inverter, a second amplifier and a second capacitor coupled to the second amplifier via a second switch. The current starved inverter also includes a second transistor coupled to the switched capacitor current sink. The integrated circuit also includes a third capacitor. A delay applied to the clock signal is dependent on a ratio between the first capacitor and the third capacitor.

The first capacitor and the third capacitor may be located in proximity such that process, voltage and temperature variations affect the first capacitor and the third capacitor similarly.

The integrated circuit may also include a first inverter coupled to the output of the current starved inverter and a second inverter coupled to an output of the first inverter. The third capacitor may be coupled to an output of the second inverter. The first dummy inverter and the second dummy inverter may have configurations similar to a configuration of the first inverter. The delay generated by the delay cell may be proportional to a switched-capacitor clock period.

The first inverter may include a third transistor and a fourth transistor. The first dummy inverter may include a fifth transistor and a sixth transistor. The fifth transistor may have similar width and length configurations as the third transistor. The sixth transistor may have similar width and length configurations as the fourth transistor. The integrated circuit may also include a third inverter. The current starved inverter may receive an input clock signal. The third inverter may output a delayed clock signal.

An inverting input of the first amplifier may be coupled to the first dummy inverter. A voltage at the inverting input of the first amplifier may be a trip voltage of the first dummy inverter. The third capacitor may be coupled between a first inverter input and a third inverter input. The third capacitor may be coupled between an output of the current starved inverter and ground. The delay applied to the clock signal may also be dependent on a current mirror ratio between the switched capacitor current source and the switched capacitor current sink.

The delay cell may be used in a multi-phase clock generator. The delay cell may have a precisely controlled duty-cycle and non-overlapping time. The multi-phase clock generator may include a state machine, a first delay cell coupled to the state machine, a second delay cell coupled to the state machine, a third delay cell coupled to the state machine, an output clock box coupled to the state machine and an AND gate.

A method for delaying a clock signal is also described. An input clock signal is received. A delay is applied to the input clock signal that is minimally dependent on process, voltage and temperature variation. A delayed version of the input clock signal is output. The method may be performed by a delay cell.

An apparatus for delaying a clock signal is described. The apparatus includes means for receiving an input clock signal. The apparatus also includes means for applying a delay to the input clock signal that is minimally dependent on process, voltage and temperature variation. The apparatus further includes means for outputting a delayed version of the input clock signal.

An integrated circuit for delaying a clock signal is also described. The integrated circuit includes a current starved inverter. The current starved inverter includes a switched capacitor current source. The switched capacitor current source includes a first dummy inverter, a first amplifier coupled to the first dummy inverter and a first capacitor coupled the first amplifier via a first switch. The current starved inverter also includes a first transistor coupled to the switched capacitor current source and a second transistor coupled to the first transistor. The integrated circuit also includes a second capacitor. A delay applied to the clock signal is dependent on a ratio between the first capacitor and the second capacitor.

An integrated circuit for delaying a clock signal is described. The integrated circuit includes a current starved inverter. The current starved inverter includes a first transistor coupled to an input of the current starved inverter and a switched capacitor current sink. The switched capacitor current sink includes a first dummy inverter, a first amplifier and a first capacitor coupled to the first amplifier via a first switch. The current starved inverter also includes a second transistor coupled to the switched capacitor current sink. The integrated circuit also includes a second capacitor. A delay applied to the clock signal is dependent on a ratio between the first capacitor and the second capacitor.

DETAILED DESCRIPTION

Figure 1:
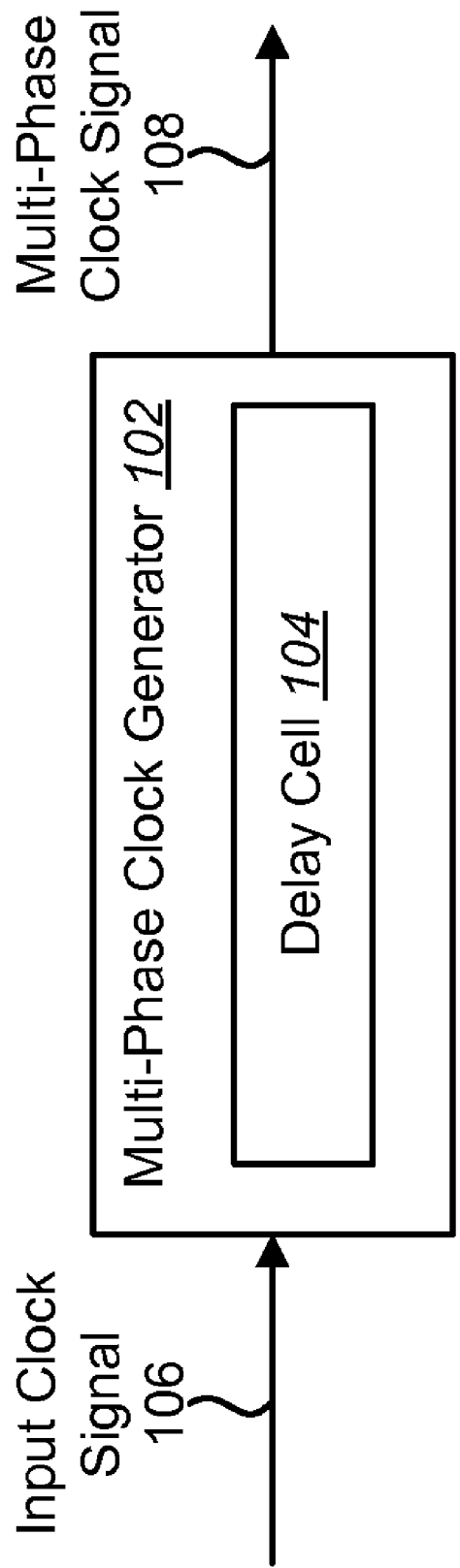
FIG. 1 shows a multi-phase clock generator for use in the present systems and methods.

FIG. 1 shows a multi-phase clock generator 102 for use in the present systems and methods. The multi-phase clock generator 102 may be used as part of a coder/decoder (CODEC), an analog-to-digital converter (ADC), a digital-to-analog converter (DAC), etc. The multi-phase clock generator 102 may include a delay cell 104. The delay cell 104 may introduce delay to an input clock signal 106 received by the multi-phase clock generator 102. The multi-phase clock generator 102 may then output a multi-phase clock signal 108.

It may be desirable that the multi-phase clock generator 102 generate a multi-phase clock signal 108 without changing the clock frequency (i.e., without modifying the frequency of the input clock signal 106). It may also be desirable that the delay cell 104 have a well-controlled programmable duty cycle for each phase and a non-overlap time. The delay cell 104 should be minimally affected by process, voltage and temperature (PVT) variation and use low power. The delay cell 104 should also have a fast response with switching duty-cycle programmability created when needed. Finally, the delay cell 104 should be glitch-free.

Existing multi-phase clock generators require a high-frequency input clock, since the pulse-width resolution is limited by the input clock period. However, in some applications, a high-frequency clock is not always available. The frequency of the multi-phase clock may depend on counter programmability and can vary significantly. There may even be an interdependency of duty-cycle programming and the output frequency. Thus, existing multi-phase clock generators may require a complicated look-up table for users and constraints for a particular program value. The non-overlap time may be generated using a current-starved inverter with a current proportional to Vbg/R (a constant bandgap voltage/resistance) and a metal-on-metal (MOM) capacitor. The resistor R, the capacitor C and the inverter trip-point may vary over process, voltage and temperature (PVT). Thus, the non-overlap time may vary by +/−40% over process, voltage and temperature (PVT). Other schemes may use delay locked loop (DLL) based delay cells to control the duty-cycle and non-overlap time. However, these schemes have a big power and area overhead along with a slow response time. They are thus not suitable for some applications.

Figure 2:
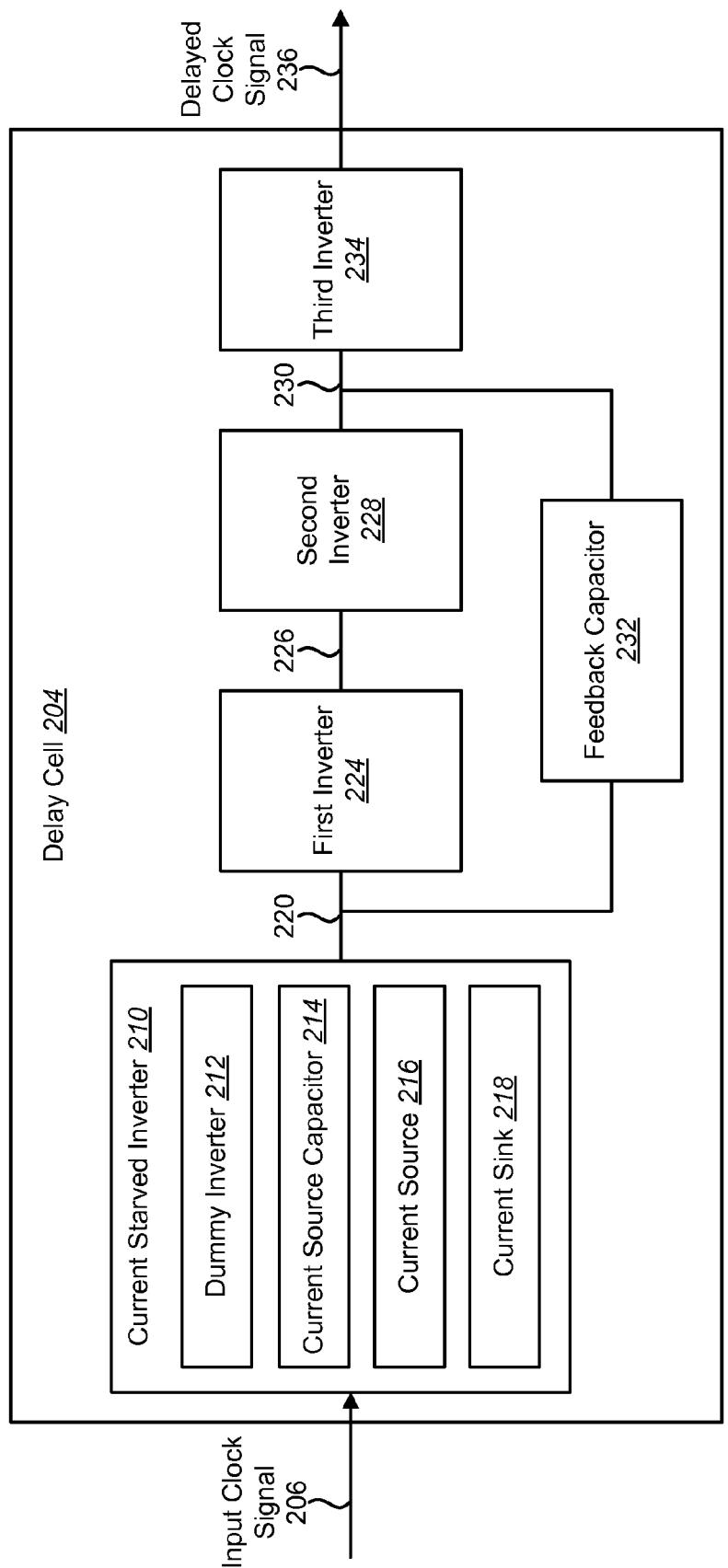
FIG. 2 is a block diagram illustrating a delay cell.

FIG. 2 is a block diagram illustrating a delay cell 204. The delay cell 204 of FIG. 2 may be one configuration of the delay cell 104 of FIG. 1. A more detailed circuit diagram of a delay cell 204 is discussed below in relation to FIG. 3. The delay cell 204 may include a current starved inverter 210. The current starved inverter 210 may be an inverter with limited current sourcing and current sinking capability. For example, the current starved inverter 210 may include a current source 216 in series with a p-type metal oxide semiconductor (PMOS) transistor and a current sink 218 in series with an n-type metal oxide semiconductor (NMOS) transistor. The current starved inverter 210 may include a dummy inverter 212 and a current source capacitor 214. The dummy inverter 212 and the current source capacitor 214 may be used by the delay cell 204 to introduce a delay to the input clock signal 206 that is minimally dependent on process, voltage and temperature (PVT) variation. The dummy inverter 212 may include transistors with similar or equal configurations to the transistors used in the first inverter 224.

The current starved inverter 210 may receive the input clock signal 206. The current starved inverter 210 may be coupled to a first node 220. A first inverter 224 may be coupled between the first node 220 and a second node 226. A second inverter 228 may be coupled between the second node 226 and a third node 230. A feedback capacitor 232 may be coupled between the first node 220 and the third node 230. A third inverter 234 may also be coupled to the third node 230. The third inverter 234 may output a delayed clock signal 236. The delay in the delayed clock signal 236 may be dependent on a ratio between the feedback capacitor 232 and the current source capacitor 214.

The delay from the delay cell 204 may be expressed as $t_{delay}$ and may be calculated using Equation (1):

$$t_{delay} = \frac{Vtrip}{\frac{Isc}{C1}} = \frac{Vtrip \cdot C1}{Isc}. \tag{1}$$

In Equation (1), the voltage Vtrip is the trip voltage of the first inverter 224 (i.e., the point in an inverter when the input of the inverter is equal to the output of the inverter) (and thus the trip voltage of the dummy inverter 212), C1 is the capacitance of the feedback capacitor 232 and Isc is the current generated by the current source 216 and pulled by the current sink 218. The current Isc may be calculated using Equation (2):

$$Isc = \alpha \cdot Vtrip \cdot F \cdot C2. \tag{2}$$

In Equation (2), α is the current mirror ratio between the current source 216 and the current sink 218, F is the frequency of the input clock signal 206 and C2 is the capacitance of the current source capacitor 214. In reference to FIG. 4 discussed below, α is the ratio of the current in the first PMOS transistor 458 to the current in the second PMOS transistor 460. Combining Equation (1) and Equation (2) gives Equation (3):

$$t_{delay} = \frac{Vtrip \cdot C1}{\alpha \cdot Vtrip \cdot F \cdot C2} = \frac{1}{\alpha} \cdot \frac{C1}{C2} \cdot T. \tag{3}$$

In Equation (3), T is the period of the input clock signal 206 and is equal to 1/F. Equation (3) may be rewritten to obtain Equation (4):

$$\frac{t_{delay}}{T} = \frac{1}{\alpha} \cdot \frac{C1}{C2}. \tag{4}$$

The delay time $t_{delay}$ is a fraction of the input clock signal 206 period T (e.g., the duty-cycle). The delay time $t_{delay}$ is purely determined by the current mirror ratio α and the ratio between the feedback capacitor C1 232 and the current source capacitor C2 214. Current mismatch introduced error can be improved by optimizing the current mirror design. Because the feedback capacitor C1 232 and the current source capacitor C2 214 are located on the same portion of the same integrated circuit, process, voltage and temperature (PVT) variations will affect the feedback capacitor C1 232 and the current source capacitor C2 214 similarly. The delay time $t_{delay}$ may vary by +/−5% over process, voltage and temperature (PVT) variations (as compared to +/−40% variation for other delay cells).

Figure 3A:
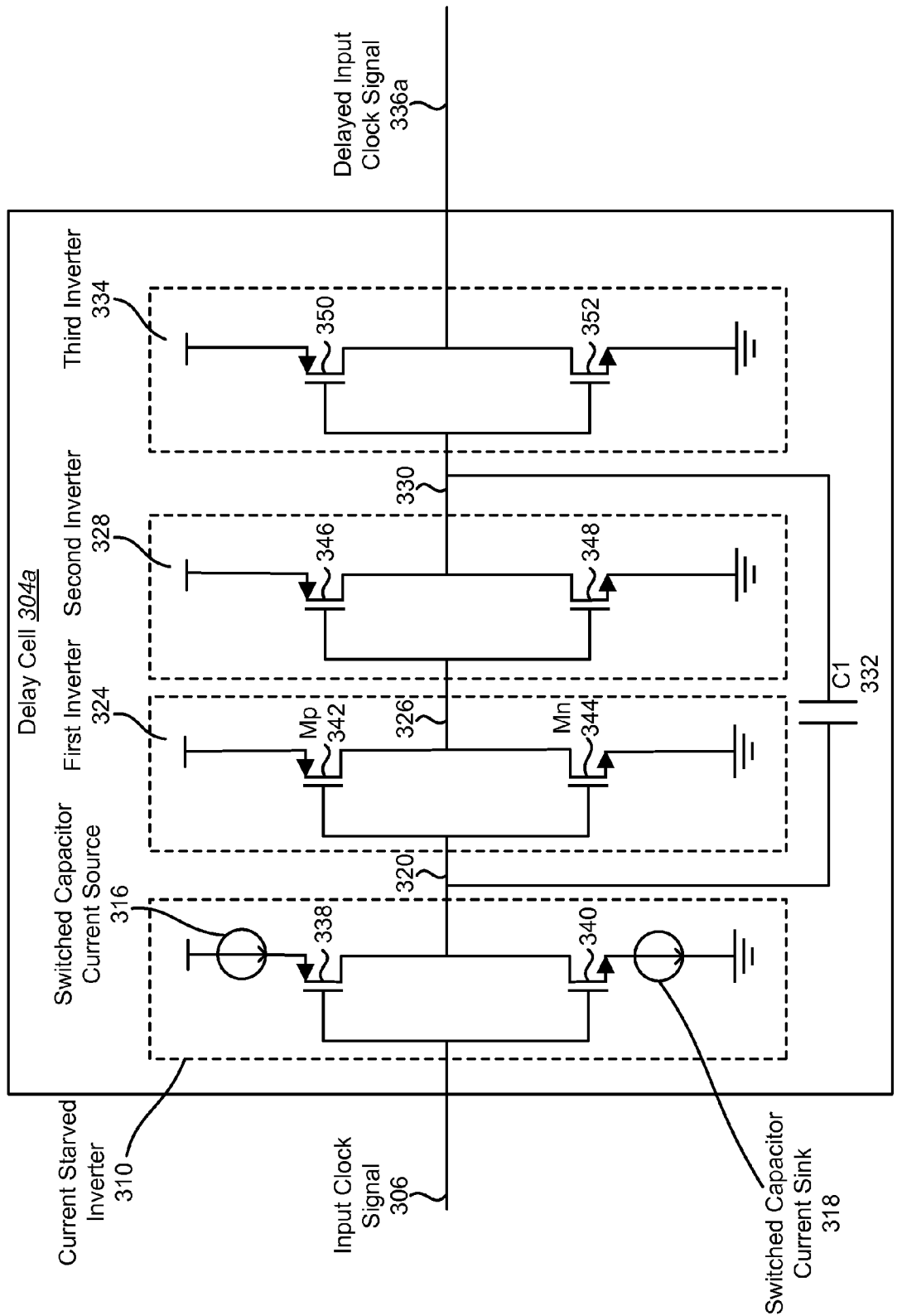
FIG. 3A is a circuit diagram illustrating one configuration of a delay cell.

FIG. 3A is a circuit diagram illustrating one configuration of a delay cell 304a. The delay cell 304a of FIG. 3A may be one configuration of the delay cell 104 of FIG. 1. The delay cell 304a may introduce a delay to an input clock signal 306 that is minimally dependent on process, voltage and temperature (PVT) variation. The delay cell 304a may include a current starved inverter 310. The current starved inverter 310 may include a PMOS transistor 338, an NMOS transistor 340, a switched capacitor current source 316 and a switched capacitor current sink 318. The gate of the PMOS transistor 338 may be coupled to an input of the delay cell 304a that receives the input clock signal 306. The source of the first PMOS transistor 338 may be coupled to the switched capacitor current source 316. Switched capacitor current sources 316 are discussed in additional detail below in relation to FIG. 4.

The drain of the PMOS transistor 338 may be coupled to a first node 320. The drain of the NMOS transistor 340 may also be coupled to the first node 320. The gate of the NMOS transistor 340 may be coupled to the input of the delay cell 304a. The source of the NMOS transistor 340 may be coupled to the switched capacitor current sink 318. Switched capacitor current sinks 318 are discussed in additional detail below in relation to FIG. 5.

The first node 320 may be coupled to the input of a first inverter 324. The first inverter 324 may include a PMOS transistor Mp 342 and an NMOS transistor Mn 344. The gate of the PMOS transistor Mp 342 may be coupled to the first node 320. The source of the PMOS transistor Mp 342 may be coupled to a source voltage. The drain of the PMOS transistor Mp 342 may be coupled to a second node 326. The second node 326 may be the output of the first inverter 324. The gate of the NMOS transistor Mn 344 may be coupled to the first node 320. The source of the NMOS transistor Mn 344 may be coupled to ground. The drain of the NMOS transistor Mn 344 may be coupled to the second node 326.

The output of the first inverter 324 (i.e., the second node 326) may be coupled to the input of a second inverter 328. The second inverter 328 may include a PMOS transistor 346 and an NMOS transistor 348. The gate of the PMOS transistor 346 may be coupled to the second node 326. The source of the PMOS transistor 346 may be coupled to a source voltage. The drain of the PMOS transistor 346 may be coupled to a third node 330. The third node 330 may be the output of the second inverter 328. The gate of the NMOS transistor 348 may be coupled to the second node 326. The source of the NMOS transistor 348 may be coupled to ground. The drain of the NMOS transistor 348 may be coupled to the third node 330. A feedback capacitor C1 332 may be coupled between the first node 320 and the third node 330.

The third node 330 may be coupled to the input of a third inverter 334. The third inverter 334 may include a PMOS transistor 350 and an NMOS transistor 352. The gate of the PMOS transistor 350 may be coupled to the third node 330. The source of the PMOS transistor 350 may be coupled to the source voltage. The drain of the PMOS transistor 350 may be coupled to the output of the third inverter 334. The output of the third inverter 334 may be the delayed clock signal 336a. The delay between the input clock signal 306 and the delayed input clock signal 336a may be proportional to a clock period used by the switched capacitor current source 316 and the switched capacitor current sink 318. Thus, using the delay cell 304a may precisely control the clock duty cycle. The clock duty cycle generated by the delay cell is only dependent on the capacitor ratio in the switched capacitor current source 316 and switched capacitor current sink 318 and the current mirror ratio.

In one configuration, a delay cell 304a may include either a switched capacitor current source 316 or a switched capacitor current sink 318, but not both. If the delay cell 304a includes only the switched capacitor current source 316, the delay cell 304a may generate delay from a falling edge only (and not from a rising edge) of the input clock signal 306. If the delay cell 304a includes only the switched capacitor current sink 318, the delay cell 304a may generate delay from a rising edge only (and not from a falling edge) of the input clock signal 306.

Figure 3B:
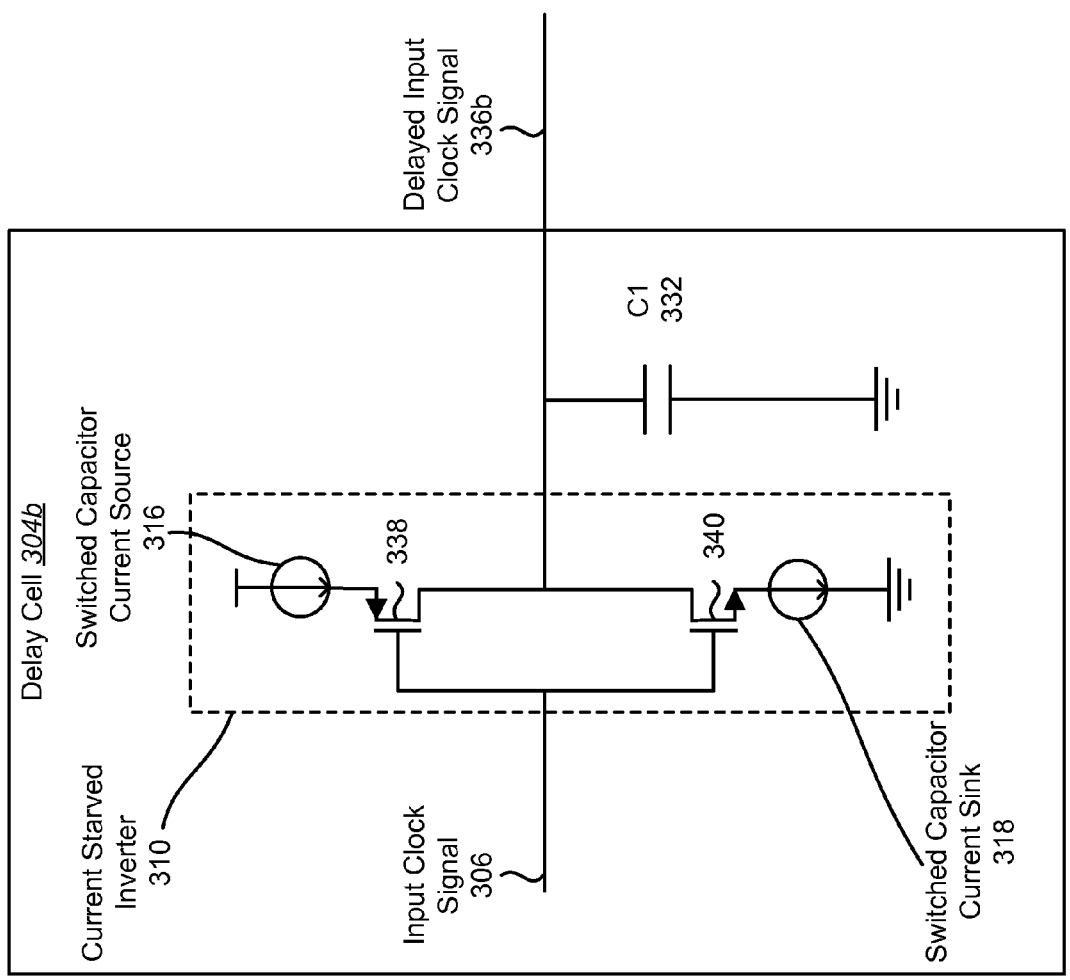
FIG. 3B is a circuit diagram illustrating another configuration of a delay cell.

FIG. 3B is a circuit diagram illustrating another configuration of a delay cell 304b. The delay cell 304b of FIG. 3B may be one configuration of the delay cell 104 of FIG. 1. The delay cell 304b may introduce a delay to an input clock signal 306 that is minimally dependent on process, voltage and temperature (PVT) variation. The delay cell 304b may include a current starved inverter 310. The current starved inverter 310 may include a PMOS transistor 338, an NMOS transistor 340, a switched capacitor current source 316 and a switched capacitor current sink 318. The gate of the PMOS transistor 338 may be coupled to an input of the delay cell 304b that receives the input clock signal 306. The source of the first PMOS transistor 338 may be coupled to the switched capacitor current source 316. Switched capacitor current sources 316 are discussed in additional detail below in relation to FIG. 4.

The drain of the PMOS transistor 338 may be coupled to a first node 320. The drain of the NMOS transistor 340 may also be coupled to the first node 320. The gate of the NMOS transistor 340 may be coupled to the input of the delay cell 304b. The source of the NMOS transistor 340 may be coupled to the switched capacitor current sink 318. Switched capacitor current sinks 318 are discussed in additional detail below in relation to FIG. 5. A delayed input clock signal 336b may then be output by the delay cell 304. A feedback capacitor C1 332 may be coupled between the delayed input clock signal 336b and ground. The benefit of adding additional inverters after the current starved inverter 310 is a faster transition for the other edge of the clock (not the delayed edge).

Figure 4:
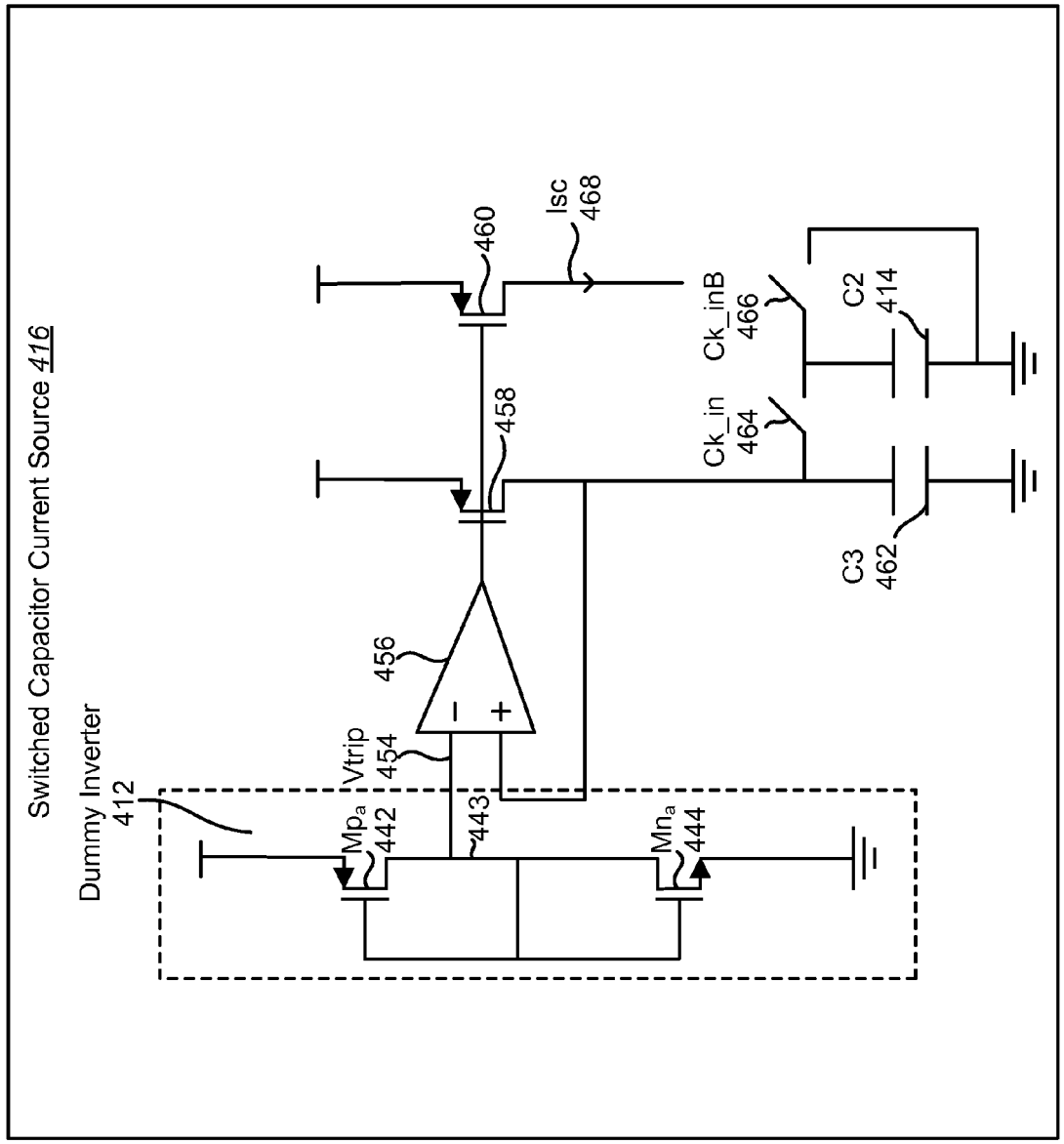
FIG. 4 is a circuit diagram of a switched capacitor current source.

FIG. 4 is a circuit diagram of a switched capacitor current source 416. The switched capacitor current source 416 of FIG. 4 may be one configuration of the switched capacitor current source 216 of FIG. 2. The switched capacitor current source 416 may track capacitor variation and the trip voltage Vtrip variation. As discussed above, the trip voltage Vtrip is the voltage when the input of an inverter equals the output of the inverter. The switch capacitor current Isc 468 may be equal to Vtrip/Req (Req is the equivalent resistance of a switched capacitor circuit that includes the capacitor C2 414, the Ck_in switch 464 and the PMOS transistor 460). Req is thus equal to $$\frac{1}{F \times C2},$$

where F is the clock frequency (i.e., the frequency of the clock signal applied to the Ck_in 464 and Ck_in B 466) and C2 is the capacitance of the capacitor C2 414. Thus, the switched capacitor current Isc 468 is proportional to Vtrip and the capacitor C2 and therefore follows the variation proportionally across process, voltage and temperature (PVT) variations.

The switched capacitor current source 416 may include a dummy inverter 412. The dummy inverter 412 may imitate the first inverter 324 of the delay cell 304. In other words, the dummy inverter 412 may include transistors with similar widths and lengths as the transistors in the first inverter 324.

The dummy inverter 412 may include a PMOS transistor Mpa 442 that imitates the PMOS transistor Mp 342 in the first inverter 324. The source of the PMOS transistor Mpa 442 may be coupled to a source voltage. The gate of the PMOS transistor Mpa 442 may be coupled to a first node 443. The drain of the PMOS transistor Mpa 442 may also be coupled to the first node 443.

The dummy inverter 412 may also include an NMOS transistor Mna 444 that imitates the NMOS transistor Mn 344 in the first inverter 324. The gate of the NMOS transistor Mna 444 may be coupled to the first node 443. The drain of the NMOS transistor Mna 444 may also be coupled to the first node 443. The source of the NMOS transistor Mna 444 may be coupled to ground.

The voltage at the first node 443 may be referred to as Vtrip 454. Vtrip 454 is the trip voltage of the dummy inverter 412 (and thus the trip voltage of the first inverter 324). The first node 443 may be coupled to the inverting input of an amplifier 456. In one configuration, the amplifier 456 may be an operational amplifier. The output of the amplifier 456 may be coupled to the gate of a first PMOS transistor 458 and a second PMOS transistor 460. The non-inverting input of the amplifier 456 may be coupled to the drain of the first PMOS transistor 458. The source of the first PMOS transistor 458 may be coupled to a source voltage. The source of the second PMOS transistor 460 may also be coupled to a source voltage.

The drain of the first PMOS transistor 458 may be coupled to ground via a capacitor C3 462. The drain of the first PMOS transistor 458 may also be coupled to a first switch 464. The first switch 464 may be controlled by the input clock signal Ck_in. The first switch 464 may be coupled to a current source capacitor C2 414. When the first switch 464 is closed, the current source capacitor C2 414 is in parallel with the capacitor C3 462. The current source capacitor C2 414 may be coupled to a second switch 466 that is controlled by the inverse of the input clock signal Ck_in B. Thus, the second switch 466 is closed whenever the first switch 464 is open and the second switch 466 is open whenever the first switch 464 is closed. When the second switch 466 is closed, both ends of the current source capacitor C2 414 are coupled to ground and any voltage across the current source capacitor C2 414 is drained.

The drain of the second PMOS transistor 460 is coupled to the output of the switched capacitor current source 416. A current is produced from the drain of the first PMOS transistor 458. A current Isc 468 is generated from the drain of the second PMOS transistor 460 that is a replica of the current generated by the first PMOS transistor 458. The second PMOS transistor 460 may be used to source the current Isc 468 to other circuitry.

Figure 5:
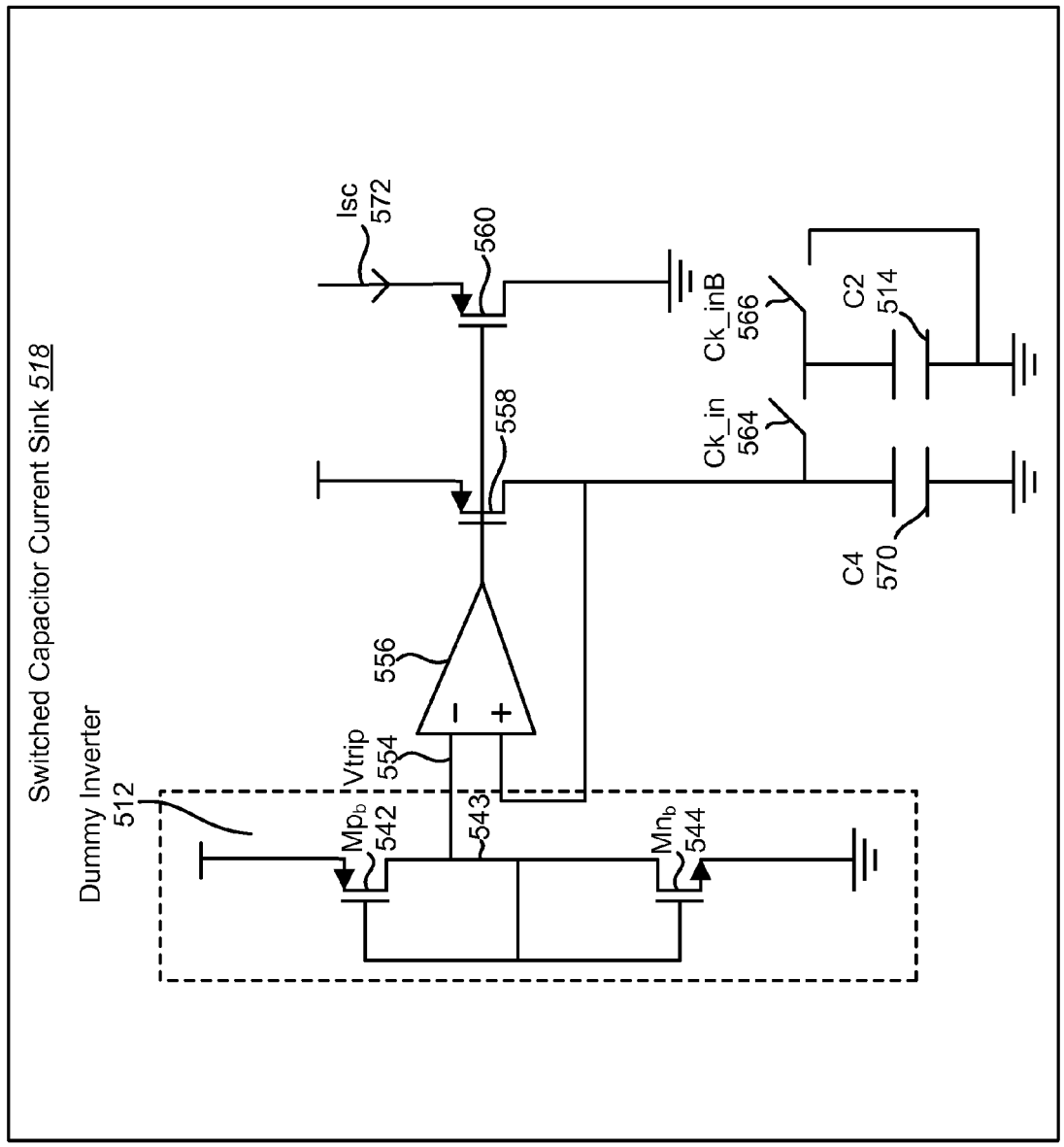
FIG. 5 is a circuit diagram of a switched capacitor current sink.

FIG. 5 is a circuit diagram of a switched capacitor current sink 518. The switched capacitor current sink 518 of FIG. 5 may be one configuration of the switched capacitor current sink 218 of FIG. 2. The switched capacitor current sink 518 may track capacitor variation and the trip voltage Vtrip 554 variation.

The switched capacitor current sink 518 may include a dummy inverter 512. The dummy inverter 512 may imitate the first inverter 324 of the delay cell 304. For example, the dummy inverter 512 may include transistors with the same widths and lengths as the transistors in the first inverter 324 of the delay cell 304. The dummy inverter 512 may include a PMOS transistor Mpb 542 that imitates the PMOS transistor Mp 342 in the first inverter 324. The source of the PMOS transistor Mpb 542 may be coupled to a source voltage. The gate of the PMOS transistor Mpb 542 may be coupled to a first node 543. The drain of the PMOS transistor Mpb 542 may also be coupled to the first node 543.

The dummy inverter 512 may also include an NMOS transistor Mnb 544 that imitates the NMOS transistor Mn 344 in the first inverter. The gate of the NMOS transistor Mnb 544 may be coupled to the first node 543. The drain of the NMOS transistor Mnb 544 may also be coupled to the first node 543. The source of the NMOS transistor Mnb 544 may be coupled to ground.

The voltage at the first node 543 may be referred to as Vtrip 554. Vtrip 554 is the trip voltage of the dummy inverter 512 (and thus the trip voltage of the first inverter 324). The first node 543 may be coupled to the inverting input of an amplifier 556. In one configuration, the amplifier 556 may be an operational amplifier. The output of the amplifier 556 may be coupled to the gate of a first PMOS transistor 558 and a second PMOS transistor 560. The non-inverting input of the amplifier 556 may be coupled to the drain of the first PMOS transistor 558. The source of the first PMOS transistor 558 may be coupled to a source voltage. The drain of the second PMOS transistor 560 may be coupled to ground.

The drain of the first PMOS transistor 558 may be coupled to ground via a capacitor C4 570. The drain of the first PMOS transistor 558 may also be coupled to a first switch 564. The first switch 564 may be controlled by the input clock signal Ck_in. The first switch 564 may be coupled to a current sink capacitor C2 514. When the first switch 564 is closed, the current sink capacitor C2 514 is in parallel with the capacitor C4 570. The current sink capacitor C2 514 may be coupled to a second switch 566 that is controlled by the inverse of the input clock signal Ck_in B. Thus, the second switch 566 is closed whenever the first switch 564 is open and the second switch 566 is open whenever the first switch 564 is closed. When the second switch 566 is closed, both ends of the current sink capacitor C2 514 are coupled to ground and any voltage across the current sink capacitor C2 514 is drained.

The source of the second PMOS transistor 560 may be coupled to the input of the switched capacitor current sink 518. A current Isc 572 is pulled from the input of the switched capacitor current sink 518.

Figure 6:
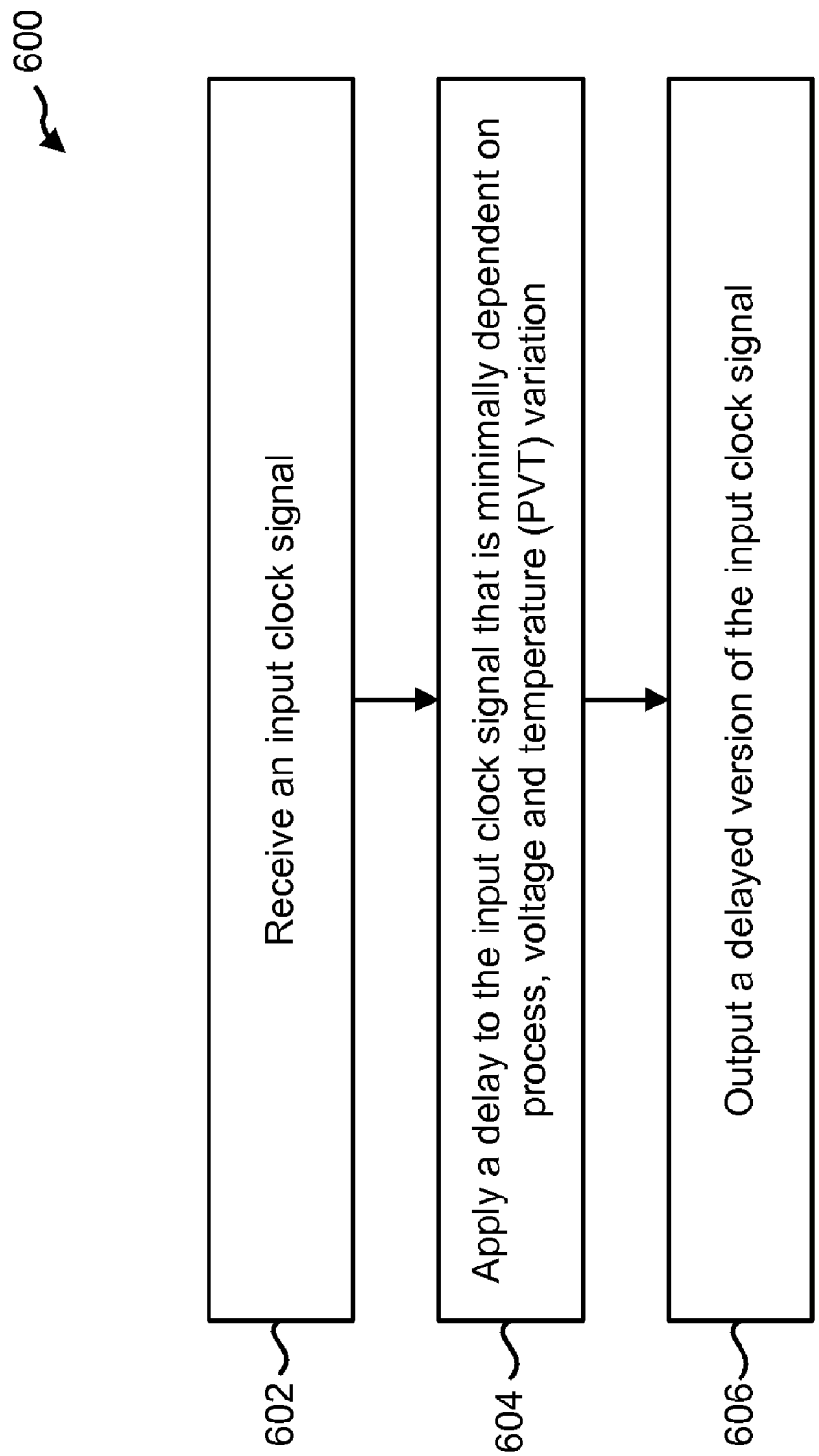
FIG. 6 is a flow diagram of a method for introducing a delay to a clock signal.

FIG. 6 is a flow diagram of a method 600 for introducing a delay to a clock signal 206. The method 600 may be performed by a delay cell 204. The delay cell 204 may be part of multi-phase clock generator 102. The delay cell 204 may receive 602 an input clock signal 206. The delay cell 204 may apply 604 a delay to the input clock signal 206 that is minimally dependent on process, voltage and temperature (PVT) variation. The delay applied may vary according to the process, voltage and temperature (PVT) variation by +/−5%. The delay cell 204 may then output 606 a delayed version of the input clock signal 206. The delayed version of the input clock signal 206 may be referred to as a delayed clock signal 236.

Figure 7:
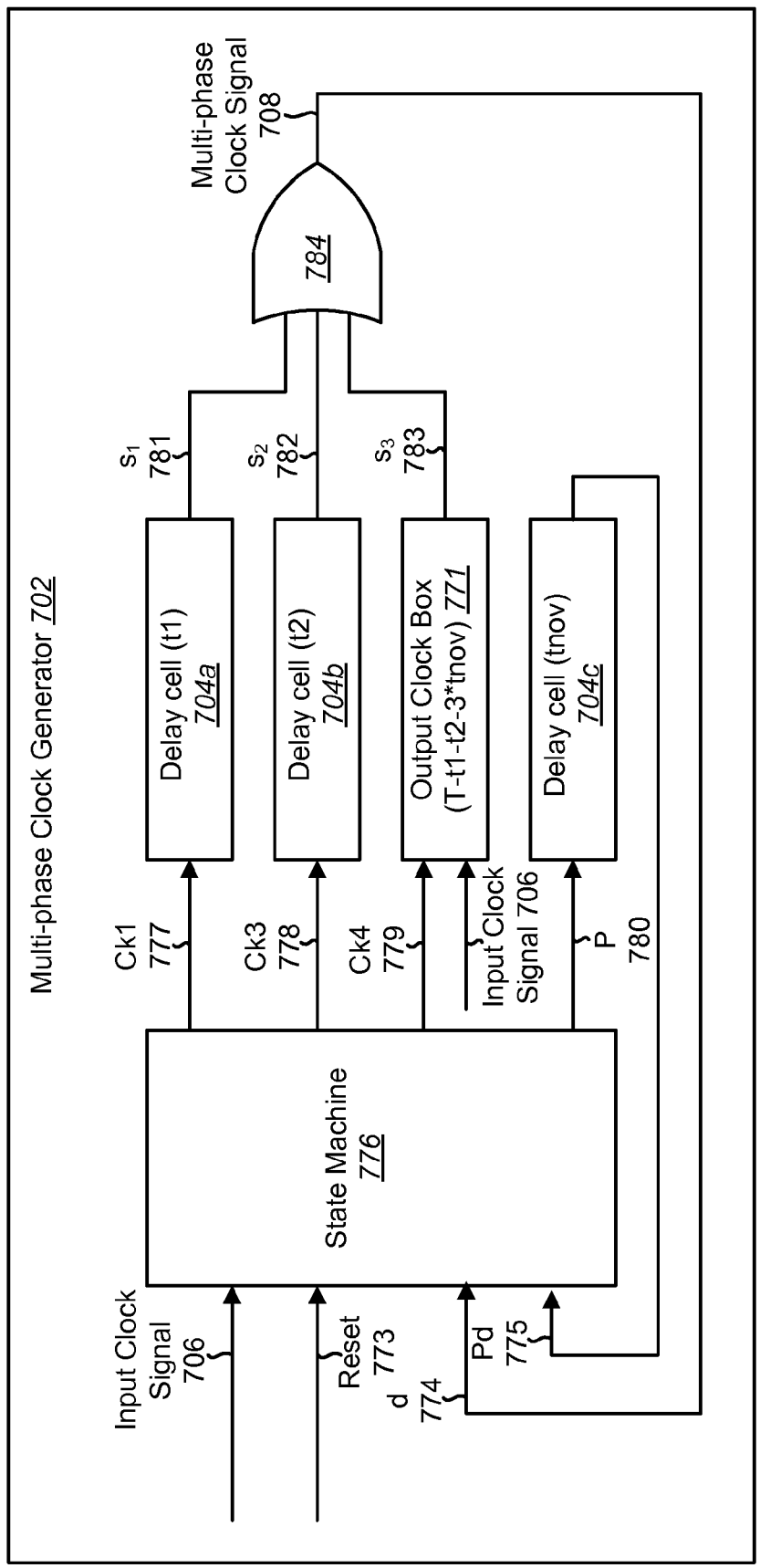
FIG. 7 is a block diagram illustrating one configuration of a multi-phase clock generator.

FIG. 7 is a block diagram illustrating one configuration of a multi-phase clock generator 702. The multi-phase clock generator 702 of FIG. 7 may be one configuration of the multi-phase clock generator 102 of FIG. 1. The multi-phase clock generator 702 may include a state machine 776. The state machine 776 is not the only way to apply the delay cell 304. For example, the delay cell can also be applied to a two phase clock to generate a two phase clock with precise duty cycle. Another example is just generating a precise delay to an input clock. The delay cell 304 has a wide range of applications in coders/decoders (CODEC), an analog-to-digital converter (ADC), a digital-to-analog converter (DAC), a phase locked loop (PLL) and timing circuits.

The state machine 776 may be the same as an all-digital counter-based scheme. The output frequency is fixed and is the same as the input frequency. The multi-phase clock generator 702 may have no inter-dependency of duty-cycle programmability and output clock frequency. As long as the clock frequency is equal to or higher than the maximum charge pump (CP) clock (e.g., 768 kilohertz (kHz)), a high-frequency input clock is not required.

The state machine 776 may receive an input clock signal 706, a reset signal 773, a d signal 774 and a Pd signal 775 (a delayed version of the P signal 780). The input clock signal 706 may have a period of T. The state machine may output a clock signal Ck1 777, a clock signal Ck3 778, a clock signal Ck4 779 and P 780. The clock signal Ck1 777 may be input to a delay cell (t1) 704*a* with a delay of t1. The delay cell (t1) 704*a* of FIG. 7 may be one configuration of the delay cell 104 of FIG. 1. The Ck1 pulse-width is determined by the delay t1. The delay cell (t1) 704*a* may output a signal s1 781 that is a delayed version of the clock signal Ck1 704.

The clock signal Ck3 778 may be input to a delay cell (t2) 704*b* with a delay of t2. The delay cell (t2) 704*b* of FIG. 7 may be one configuration of the delay cell 104 of FIG. 1. The Ck3 pulse-width is determined by the delay t2. The delay cell (t2) 704*b* may output a signal s2 782 that is a delayed version of the clock signal Ck3 778. The signal P 780 may be input to a non-overlap delay cell (tnov) 704*c* with a delay of tnov. The delay cell (tnov) 704*c* of FIG. 7 may be one configuration of the delay cell 104 of FIG. 1. The non-overlap time between clock phases is determined by the delay tnov. The delay cell (tnov) 704*c* may then output a delayed signal Pd 775 that is input to the state machine 776.

The clock signal Ck4 779 and the input clock signal 706 may be input to an output clock box 771. The output clock box 771 may set the pulse width of the Ck4 pulse. In one configuration, the output clock box 771 may set the Ck4 pulse width as T-t1-t2-3*tnov so that the output clock frequency is the same as the input clock frequency. The output clock box 771 may output a signal s3 783. The signals s1 781, s2 782 and s3 783 may be input to an AND gate 784. The AND gate 784 may then output a multi-phase clock signal 708. The multi-phase clock signal 708 may be fed back to the state machine 776 as the input signal d 774.

Figure 8:
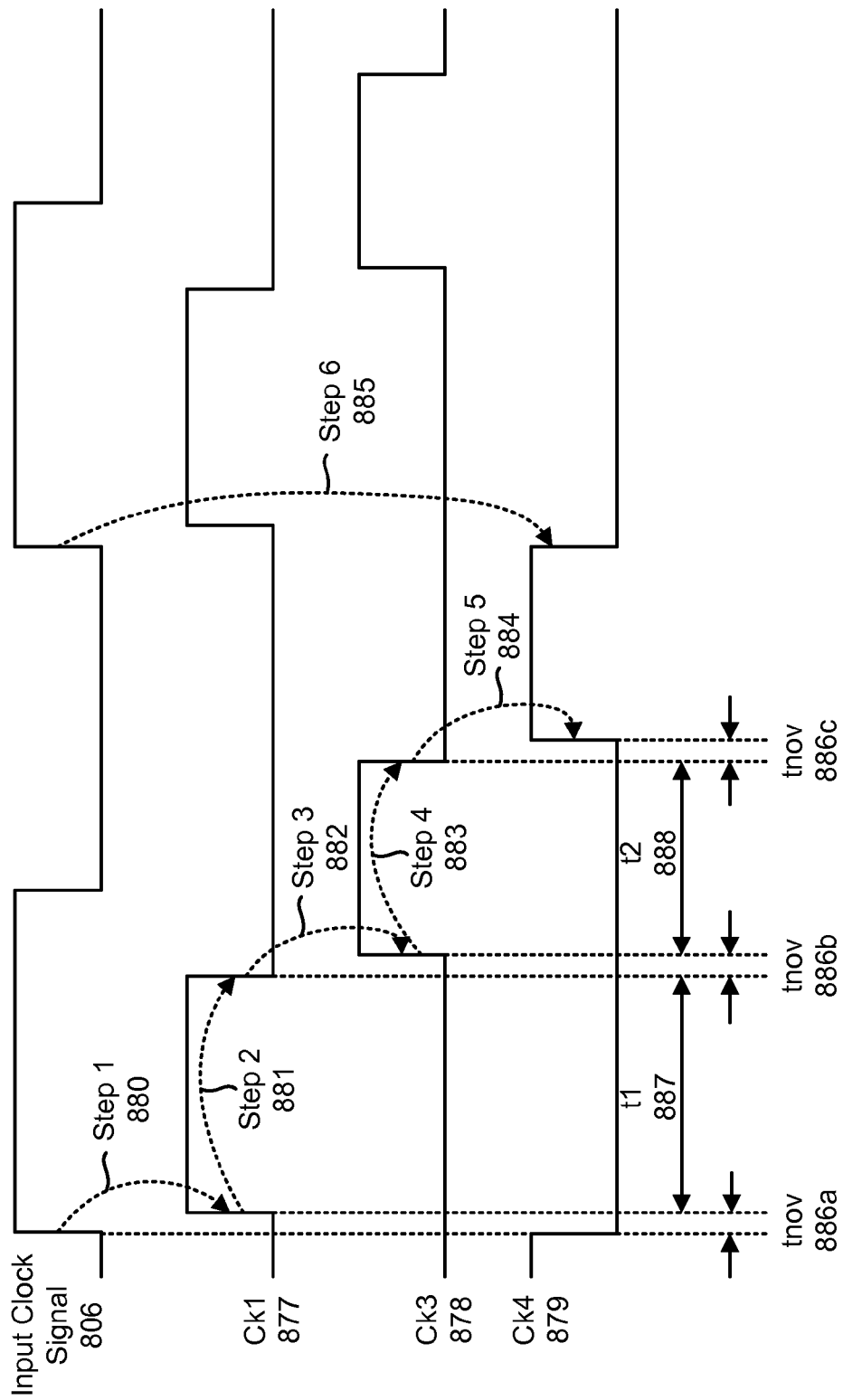
FIG. 8 is a timing diagram illustrating the generation of a multi-phase clock signal by a multi-phase clock generator.

FIG. 8 is a timing diagram illustrating the generation of a multi-phase clock signal 708 by a multi-phase clock generator 702. The waveform for an input clock signal 806 is shown. In Step 1 880, a clock signal Ck1 877 goes from a low state to a high state (i.e., a rising edge) with a delay of tnov 886*a* from the input clock signal 806 moving from a low state to a high state. In Step 2 881, the clock signal Ck1 877 returns to a low state (i.e., a falling edge) after a delay of t1 887. In Step 3 882, a clock signal Ck3 878 goes from a low state to a high state with a delay of tnov 886*b* from the clock signal Ck1 877 moving from a high state to a low state.

In Step 4 883, the clock signal Ck3 878 goes from a high state to a low state after a delay of t2 888. In Step 5 884, a clock signal Ck4 879 goes from a low state to a high state with a delay of tnov 886*c* from the clock signal Ck3 878 moving from a high state to a low state. In Step 6 885, the clock signal Ck4 879 moves from a high state to a low state when the input clock signal 806 moves from a low state to a high state. Thus, a multi-phase clock signal from the input clock signal 806 has been generated.

Figure 9:
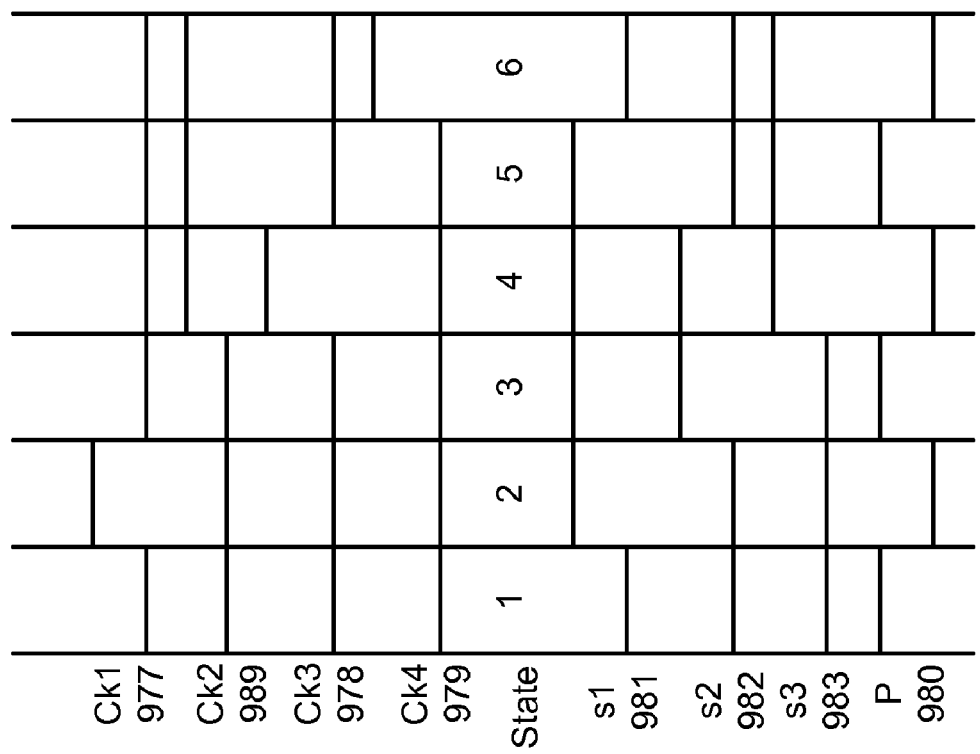
FIG. 9 is a timing diagram illustrating the state definitions in the state machine.

FIG. 9 is a timing diagram illustrating the state definitions in the state machine 776. The state machine 776 may have six distinct states with three state variables s1 981, s2 982 and s3 983. In State 1, the clock signal Ck1 977 may be low, the clock signal Ck2 989 may be low, the clock signal Ck3 978 may be low, the clock signal Ck4 979 may be low, s1 981 may be low, s2 982 may be low, s3 983 may be low and P 980 may be high. The signal P 980 may be the output of the state machine 776 that is input to the delay cell (tnov) 704*c*. Thus, the signal P 980 alternates between high and low for each state.

In State 2, the clock signal Ck1 977 may be high, the clock signal Ck2 989 may be low, the clock signal Ck3 978 may be low, the clock signal Ck4 979 may be low, s1 981 may be high, s2 982 may be low, s3 983 may be low and p 980 may be low. In State 3, the clock signal Ck1 977 may be low, the clock signal Ck2 989 may be low, the clock signal Ck3 978 may be low, the clock signal Ck4 979 may be low, s1 981 may be high, s2 982 may be high, s3 983 may be low and p 980 may be high.

In State 4, the clock signal Ck1 977 may be low, the clock signal Ck2 989 may be high, the clock signal Ck3 978 may be high, the clock signal Ck4 979 may be low, s1 981 may be high, s2 982 may be high, s3 983 may be high and p 980 may be low. In State 5, the clock signal Ck1 977 may be low, the clock signal Ck2 989 may be high, the clock signal Ck3 978 may be low, the clock signal Ck4 979 may be low, s1 981 may be high, s2 982 may be low, s3 983 may be high and p 980 may be high. In State 6, the clock signal Ck1 977 may be low, the clock signal Ck2 989 may be high, the clock signal Ck3 978 may be low, the clock signal Ck4 979 may be high, s1 981 may be low, s2 982 may be low, s3 983 may be high and p 980 may be low.

Figure 10:
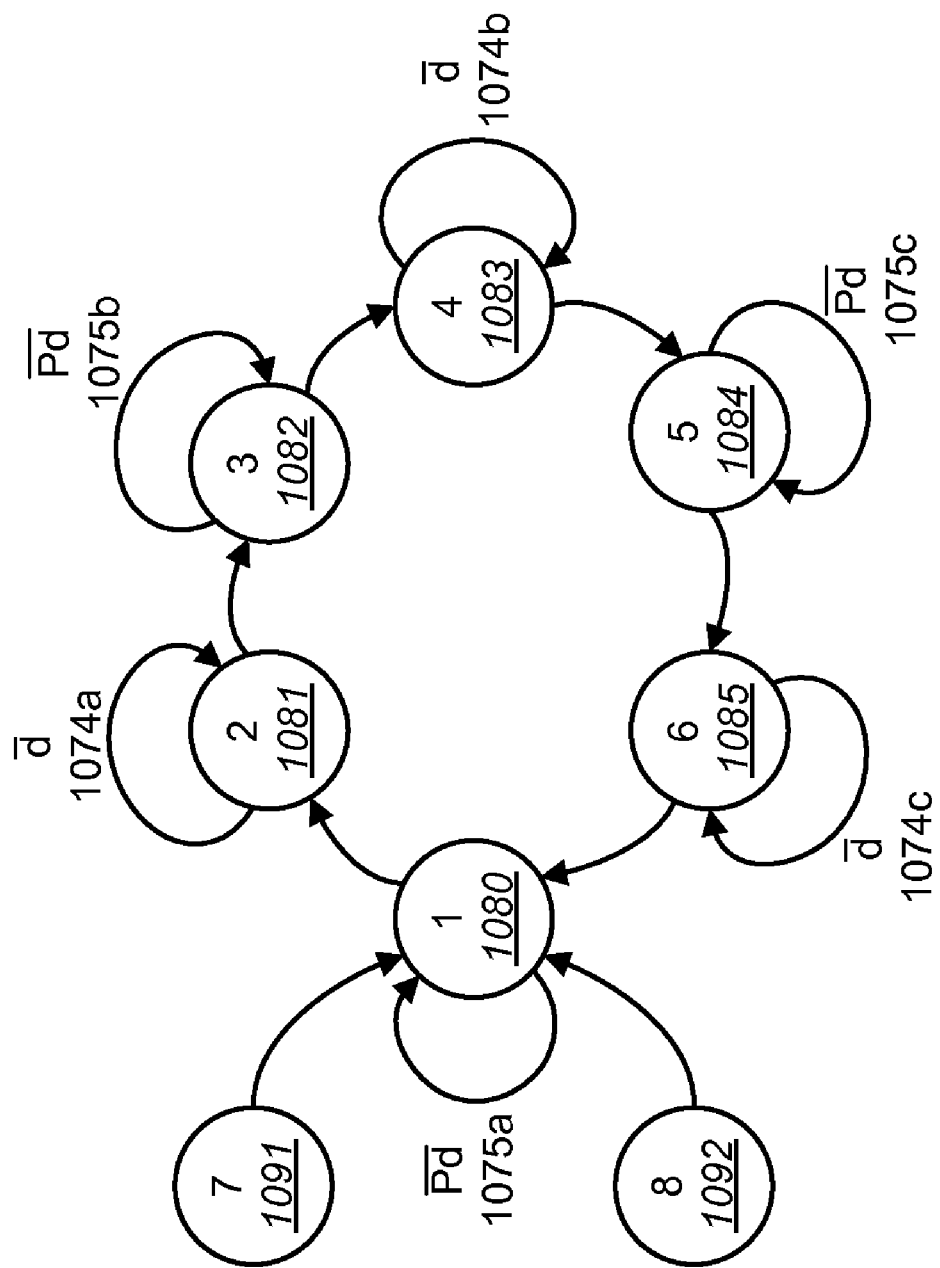
FIG. 10 is a state transition diagram for a state machine.

FIG. 10 is a state transition diagram for a state machine 776. The state machine 776 may cycle between State 1 1080, State 2 1081, State 3 1082, State 4 1083, State 5 1084 and State 6 1085. State 1 1080 may be dependent on the signal Pd 1075*a*. State 2 1081 may be dependent on the signal d 1074*a*. State 3 1082 may be dependent on the signal Pd 1075*b*. State 4 1083 may be dependent on the signal d 1074*b*. State 5 1084 may be dependent on the signal Pd 1075*c*. State 6 1085 may be dependent on the signal d 1074*c*. The state machine 776 may cycle into State 1 1080 from a State 7 1091 or a State 8 1092.

Figure 11:
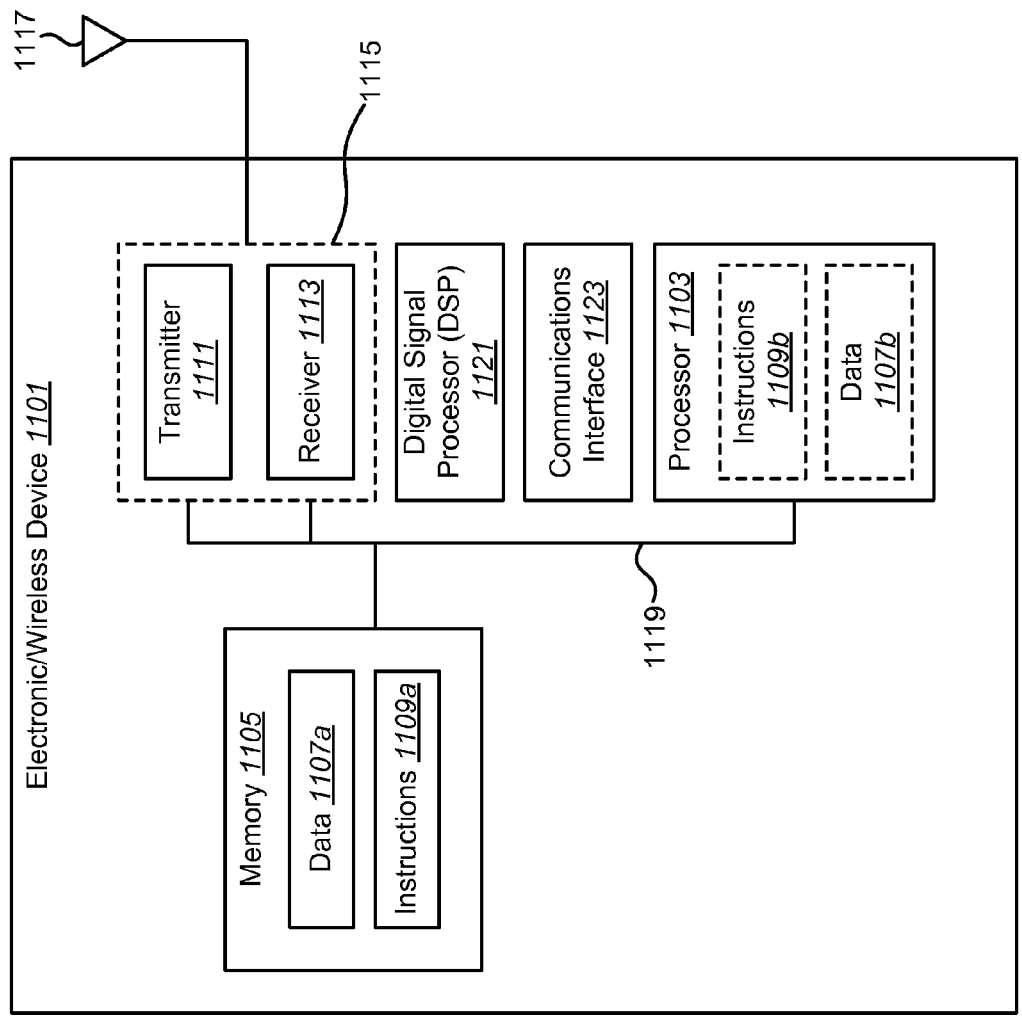
FIG. 11 illustrates certain components that may be included within a wireless device.

FIG. 11 illustrates certain components that may be included within an electronic/wireless device 1101. The electronic/wireless device 1101 may be an access terminal, a mobile station, a user equipment (UE), a base station, a node B, an evolved Node B, etc. The electronic/wireless device 1101 includes a processor 1103. The processor 1103 may be a general purpose single- or multi-chip microprocessor (e.g., an ARM), a special purpose microprocessor (e.g., a digital signal processor (DSP)), a microcontroller, a programmable gate array, etc. The processor 1103 may be referred to as a central processing unit (CPU). Although just a single processor 1103 is shown in the electronic/wireless device 1101 of FIG. 11, in an alternative configuration, a combination of processors (e.g., an ARM and DSP) could be used.

The electronic/wireless device 1101 also includes memory 1105. The memory 1105 may be any electronic component capable of storing electronic information. The memory 1105 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 1107a and instructions 1109a may be stored in the memory 1105. The instructions 1109a may be executable by the processor 1103 to implement the methods disclosed herein. Executing the instructions 1109a may involve the use of the data 1107a that is stored in the memory 1105. When the processor 1103 executes the instructions 1109a, various portions of the instructions 1109b may be loaded onto the processor 1103, and various pieces of data 1107b may be loaded onto the processor 1103.

The electronic/wireless device 1101 may also include a transmitter 1111 and a receiver 1113 to allow transmission and reception of signals to and from the wireless communication device 1101. The transmitter 1111 and receiver 1113 may be collectively referred to as a transceiver 1115. An antenna 1117 may be electrically coupled to the transceiver 1115. The electronic/wireless device 1101 may also include (not shown) multiple transmitters, multiple receivers, multiple transceivers and/or multiple antenna. The electronic/wireless device 1101 may further include a digital signal processor (DSP) 1121 and a communications interface 1123.

The various components of the electronic/wireless device 1101 may be coupled together by one or more buses, which may include a power bus, a control signal bus, a status signal bus, a data bus, etc. For the sake of clarity, the various buses are illustrated in FIG. 11 as a bus system 1119.

The term "coupled" encompasses a wide variety of connections. For example, the term "coupled" should be interpreted broadly to encompass circuit elements directly connected to each other and circuit elements indirectly connected via other circuit elements.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The terms "computer-readable medium" or "computer-program product" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 6, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. An integrated circuit for delaying a clock signal via a delay cell, the integrated circuit comprising:
a current starved inverter, wherein the current starved inverter comprises:
a switched capacitor current source comprising:
a first dummy inverter;
a first amplifier coupled to the first dummy inverter; and
a first capacitor coupled the first amplifier via a first switch;
a first transistor coupled to the switched capacitor current source;
a switched capacitor current sink comprising:
a second dummy inverter;
a second amplifier; and
a second capacitor coupled to the second amplifier via a second switch;
a second transistor coupled to the switched capacitor current sink; and
a third capacitor, wherein a delay applied to the clock signal is based on a ratio between the first capacitor and the third capacitor.

2. The integrated circuit of claim 1, wherein the first capacitor and the third capacitor are located on a first portion of the integrated circuit, wherein effects of one or more of process, voltage and temperature variations on the first capacitor and on the third capacitor are substantially similar.

3. The integrated circuit of claim 1, further comprising:
a first inverter coupled to the output of the current starved inverter; and
a second inverter coupled to an output of the first inverter, wherein the third capacitor is coupled to an output of the second inverter.

4. The integrated circuit of claim 3, wherein the first dummy inverter and the second dummy inverter each have a configuration substantially similar to a configuration of the first inverter.

5. The integrated circuit of claim 1, wherein the delay applied to the clock signal is proportional to a switched-capacitor clock period.

6. The integrated circuit of claim 3, wherein the first inverter comprises a third transistor and a fourth transistor, wherein the first dummy inverter comprises a fifth transistor and a sixth transistor, wherein a width of the fifth transistor is substantially the same as a width of the third transistor and a length of the fifth transistor is substantially the same as a length of the third transistor, and wherein a width of the sixth transistor is substantially the same as a width of the fourth transistor and a length of the sixth transistor is substantially the same as a length of the fourth transistor.

7. The integrated circuit of claim 3, further comprising a third inverter, wherein the current starved inverter receives an input clock signal, and wherein the third inverter outputs a delayed clock signal.

8. The integrated circuit of claim 1, wherein an inverting input of the first amplifier is coupled to the first dummy inverter, and wherein a voltage at the inverting input of the first amplifier is associated with a trip voltage of the first dummy inverter.

9. The integrated circuit of claim 3, further comprising a third inverter coupled to the output of the second inverter, wherein the third capacitor is coupled between an input of the first inverter and an input of the third inverter.

10. The integrated circuit of claim 1, wherein the third capacitor is coupled between an output of the current starved inverter and ground.

11. The integrated circuit of claim 1, wherein the delay applied to the clock signal is further based on a current mirror ratio between the switched capacitor current source and the switched capacitor current sink.

12. The integrated circuit of claim 1, wherein the delay cell is used in a multi-phase clock generator.

13. The integrated circuit of claim 1, wherein the delay cell has a precisely controlled duty-cycle and non-overlapping time.

14. The integrated circuit of claim 12, wherein the multi-phase clock generator comprises:
a state machine;
a first delay cell coupled to the state machine;
a second delay cell coupled to the state machine;
a third delay cell coupled to the state machine;
an output clock box coupled to the state machine; and
an AND gate.

15. A method for delaying a clock signal, the method comprising:
receiving an input clock signal;
applying a delay to the input clock signal via a delay cell, the delay cell comprising:
a current starved inverter comprising:
a switched capacitor current source comprising:
a first dummy inverter;
a first amplifier coupled to the first dummy inverter; and
a first capacitor coupled to the first amplifier via a first switch;
a first transistor coupled to the switched capacitor current source; and
a second transistor coupled to the first transistor; and
a second capacitor, wherein the delay applied to the input clock signal is dependent on a ratio between the first capacitor and the second capacitor; and
outputting a delayed version of the input clock signal.

16. The method of claim 15, wherein the current starved inverter further comprises:
a switched capacitor current sink comprising:
a second dummy inverter;
a second amplifier; and
a third capacitor coupled to the second amplifier via a second switch;
wherein the second transistor is coupled to the switched capacitor current sink.

17. The method of claim 16, wherein the delay applied to the input clock signal is further based on a current mirror ratio between the switched capacitor current source and the switched capacitor current sink.

18. The method of claim 15, wherein the first capacitor and the second capacitor are located on a first portion of an integrated circuit, wherein effects of one or more of process, voltage and temperature variations on the first capacitor and on the second capacitor are substantially similar.

19. The method of claim 15, wherein the delay cell further comprises:
a first inverter coupled to an output of the current starved inverter; and
a second inverter coupled to an output of the first inverter, wherein the second capacitor is coupled to an output of the second inverter.

20. The method of claim 19, wherein at least one of the first dummy inverter and the second dummy inverter has a configuration substantially similar to a configuration of the first inverter.

21. The method of claim 19, wherein the first inverter comprises a third transistor and a fourth transistor, wherein the first dummy inverter comprises a fifth transistor and a sixth transistor, wherein a width of the fifth transistor is substantially the same as a width of the third transistor and a length of the fifth transistor is substantially the same as a length of the third transistor, and wherein a width of the sixth transistor is substantially the same as a width of the fourth transistor and a length of the sixth transistor is substantially the same as a length of the fourth transistor.

22. The method of claim 19, wherein the delay cell further comprises a third inverter, wherein the current starved inverter receives the input clock signal, and wherein the third inverter outputs the delayed version of the input clock signal.

23. The method of claim 19, wherein the delay cell further comprises a third inverter coupled to the output of the second inverter, and wherein the second capacitor is coupled between an input of the first inverter and an input of the third inverter.

24. The method of claim 15, wherein the delay generated by the delay cell is associated with a switched-capacitor clock period.

25. The method of claim 15, wherein an inverting input of the first amplifier is coupled to the first dummy inverter, and wherein a voltage at the inverting input of the first amplifier is associated with a trip voltage of the first dummy inverter.

26. The method of claim 15, wherein the second capacitor is coupled between an output of the current starved inverter and ground.

27. The method of claim 15, wherein the delay cell is included in a multi-phase clock generator.

28. The method of claim 27, wherein the multi-phase clock generator comprises:
a state machine;
a first delay cell coupled to the state machine;
a second delay cell coupled to the state machine;
a third delay cell coupled to the state machine;
an output clock box coupled to the state machine; and
an AND gate.

29. The method of claim 15, wherein the delay cell has a precisely controlled duty-cycle and non-overlapping time.

30. An apparatus for delaying a clock signal, the apparatus comprising:
means for receiving an input clock signal;
means for applying a delay to the input clock signal comprising:
at least one of means for sourcing current or means for sinking current, wherein the at least one of the means for sourcing current or the means for sinking current is associated with a capacitance value;
a first capacitor coupled to an output of the means for applying, wherein the delay is based on a ratio between the capacitance value and the first capacitor; and
means for outputting a delayed version of the input clock signal.

31. The apparatus of claim 30, wherein a first transistor is coupled to the means for sourcing current, and wherein the means for sourcing current comprises:
a first dummy inverter;
a first amplifier coupled to the first dummy inverter; and
a second capacitor coupled the first amplifier via a first switch, wherein the capacitance value is associated with the second capacitor.

32. The apparatus of claim 31, wherein a second transistor is coupled to the means for sinking current, and wherein the means for sinking current comprises:
a second dummy inverter;
a second amplifier; and
a third capacitor coupled to the second amplifier via a second switch.

33. The apparatus of claim 31, wherein the first capacitor and the second capacitor are located on a first portion of an integrated circuit, wherein effects of at least one of process, voltage and temperature variations on the first capacitor and on the second capacitor are substantially similar.

34. An integrated circuit for delaying a clock signal, the integrated circuit comprising:
a current starved inverter, wherein the current starved inverter comprises:
a switched capacitor current source comprising:
a first dummy inverter;
a first amplifier coupled to the first dummy inverter; and
a first capacitor coupled the first amplifier via a first switch;
a first transistor coupled to the switched capacitor current source; and
a second transistor coupled to the first transistor; and
a second capacitor, wherein a delay applied to the clock signal is dependent on a ratio between the first capacitor and the second capacitor.

35. An integrated circuit for delaying a clock signal, the integrated circuit comprising:
a current starved inverter, wherein the current starved inverter comprises:
a first transistor coupled to an input of the current starved inverter;
a switched capacitor current sink comprising:
a first dummy inverter;
a first amplifier; and
a first capacitor coupled to the first amplifier via a first switch; and
a second transistor coupled to the switched capacitor current sink; and
a second capacitor, wherein a delay applied to the clock signal is dependent on a ratio between the first capacitor and the second capacitor.

36. A non-transitory computer-readable medium comprising instructions that, when executed by a processor, cause the processor to:
provide an input clock signal to a delay cell, the delay cell configured to apply a delay to the input clock signal and output a delayed input clock signal, wherein the delay cell comprises:
a current starved inverter, wherein the current starved inverter comprises:
a switched capacitor current sink comprising:
a first dummy inverter;
a first amplifier; and
a first capacitor coupled to the first amplifier via a first switch; and
a first transistor coupled to the switched capacitor current sink; and
a second capacitor, wherein the delay applied to the input clock signal is based on a ratio between the first capacitor and the second capacitor.

37. A method comprising:
receiving an input clock signal; and
outputting a delayed input clock signal, wherein the delayed input clock signal is based on a delay applied to the input clock signal via a delay cell, the delay cell comprising:
a current starved inverter comprising at least one of a switched capacitor current source or a switched capacitor current sink, wherein the at least one of the switched capacitor current source or the switched capacitor current sink includes a first capacitor; and a second capacitor coupled to an output of the current starved inverter, wherein the delay applied to the input clock signal is based on a ratio between the first capacitor and the second capacitor.

38. The method of claim 37, wherein the delay cell comprises the switched capacitor current source and the switched capacitor current sink.

39. The method of claim 37, wherein the delay cell further comprises one or more inverters coupled in series, and wherein the second capacitor is coupled between the output of the current starved inverter and an output of a particular inverter of the one or more inverters.

40. The method of claim 39, wherein the delay cell further comprises:
- a first inverter of the one or more inverters coupled to the output of the current starved inverter; and
- a second inverter of the one or more inverters coupled to an output of the first inverter, wherein the second capacitor is coupled between the output of the current starved inverter and an output of the second inverter.

41. The method of claim 37, wherein the second capacitor is coupled between the output of the current starved inverter and a ground node.

42. The method of claim 37, wherein the current starved inverter includes the switched capacitor current source, and wherein the switched capacitor current source includes the first capacitor.

43. The method of claim 37, wherein the current starved inverter includes the switched capacitor current sink, and wherein the switched capacitor current sink includes the first capacitor.

44. The method of claim 37, wherein the current starved inverter includes the switched capacitor current sink, and wherein the switched capacitor current sink comprises a dummy inverter.

45. The method of claim 44, wherein the switched capacitor current sink further comprises an amplifier having an input coupled to an output of the dummy inverter.

\* \* \* \* \*